(12) United States Patent  
Pichler

(10) Patent No.: US 6,936,407 B2  
(45) Date of Patent: Aug. 30, 2005

(54) THIN-FILM ELECTRONIC DEVICE MODULE

(75) Inventor: Karl Pichler, Santa Clara, CA (US)

(73) Assignee: Osram Opto Semiconductors GmbH, Regensburg (DE)

(*) Notice: Subject to any disclaimer, the term of this patent is extended or adjusted under 35 U.S.C. 154(b) by 0 days.

(21) Appl. No.: 10/377,380

(22) Filed: Feb. 28, 2003

(65) Prior Publication Data

US 2004/0170927 A1 Sep. 2, 2004

(51) Int. Cl.[7] .................... H01L 23/28; H01L 31/0203
(52) U.S. Cl. .................. 430/311; 257/787; 257/88; 257/433; 257/100; 345/55; 345/82; 349/149
(58) Field of Search ................. 430/311; 257/787, 257/88, 433, 100; 345/55, 82; 349/149

(56) References Cited

U.S. PATENT DOCUMENTS 5,693,956 A * 12/1997 Shi et al. ................. 257/40
5,703,394 A    12/1997 Wei et al.
5,747,363 A     5/1998 Wei et al.
5,831,699 A *  11/1998 Wright et al. ............. 349/73

FOREIGN PATENT DOCUMENTS

WO    WO 01/082390 A1    11/2001

* cited by examiner

Primary Examiner—John A. McPherson  
Assistant Examiner—Daborah Chacko-Davis  
(74) Attorney, Agent, or Firm—Thomas George

(57) ABSTRACT

In an embodiment of this invention, an encapsulated electronic thin-film device includes a substrate and an active area is fabricated on the substrate. The active area is comprised of at least one electronic thin-film element. A thin-film encapsulation layer is selectively deposited on at least the active area to cover at least the active area. Traces protrude slightly past a perimeter of the thin-film encapsulation layer. The traces are routed to two or more contact pads to which one or more connectors can attach. Attaching the connector to the contact pads allows an external device to be coupled to the active area of the electronic thin-film device.

23 Claims, 9 Drawing Sheets

ENCAPSULATED ELECTRONIC THIN-FILM DEVICE 203

PASSIVE MATRIX OLED DISPLAY
103

PASSIVE MATRIX OLED DISPLAY
103

ENCAPSULATED ELECTRONIC THIN-FILM DEVICE
203

ENCAPSULATED ELECTRONIC THIN-FILM DEVICE
203

ENCAPSULATED ELECTRONIC THIN-FILM DEVICE
403

THIN-FILM ELECTRONIC DEVICE MODULE

BACKGROUND OF THE INVENTION

An electronic thin-film device is typically encapsulated to protect it from, for example, moisture and/or oxygen in order to prevent or reduce degradation and device failure. The device contains multiple elements and these elements are typically connected to external devices. In order to connect to external devices, traces from the elements are routed to the perimeter of the electronic thin-film device where these traces are connected to the external device using, for example, one or more flex connectors, a printed circuit board ("PCB"), or a chip-on glass driver.

Examples of the electronic thin-film device are: an active or passive matrix OLED display, an active or passive matrix OLED light source, an active or passive matrix inorganic electroluminescent display, an organic or inorganic detector array, an organic or inorganic solar cell array, or an organic or inorganic thin-film transistor array. These devices are know in the art and are discussed in, for example: U.S. Pat. No. 6,069,443 entitled "Passive Matrix OLED Display"; U.S. Pat. No. 5,733,381 entitled "Thin-Film Solar Cell Array and Method of Manufacturing Same"; U.S. Pat. No. 6,459,208 entitled "Active Matrix Electroluminescent Display Device"; and U.S. Pat. No. 6,211,534 entitled "Thin Film Transistor Array and Method for Fabricating the Same". All of these patents are incorporated by reference herein in their entirety.

An active area of the electronic thin-film device has a boundary that is the perimeter of the combination of multiple electronic thin-film elements. Each electronic thin-film element includes at least two electrodes and one or more semiconductive material between the electrodes in which charge carriers move between electrodes via the material when the element is activated. Examples of electronic thin-film elements are: light emitting element (e.g., an OLED used as a pixel in a display or as a light source element in a light source), a light detector element, a solar cell element, or a thin-film transistor element. These elements, in general, are know in the art and are discussed in, for example: U.S. Pat. No. 5,457,565 entitled "Organic Electroluminescent Device"; U.S. Pat. No. 6,483,099 entitled "Organic Diodes with Switchable Photosensitivity"; U.S. Pat. No. 6,485,884 entitled "Method for Patterning Oriented Materials for Organic Electronic Displays and Devices"; and U.S. Pat. No. 4,963,196 entitled "Organic Solar Cell". All of these patents are incorporated by reference herein in their entirety.

FIG. 1 shows a schematic of a prior art passive-matrix OLED display 103. The display 103 includes an active area 115 on a substrate 121. The active area 115 includes columns of electrodes and rows of electrodes. The rows of electrodes are perpendicular to the columns of electrodes. An organic layer is between the columns of electrodes and the rows of electrodes. OLED pixels are formed at the intersections of the columns of electrodes and the rows of electrodes. Row conductive traces 106 are coupled to the rows of electrodes and column conductive traces 109 are coupled to the columns of electrodes. The row conductive traces 106 and the column conductive traces 109 are routed to only one side of the display 103; for example, in FIG. 1, these traces are routed to the bottom-end. The other end of the traces is routed to a contact pad 118 that is used to couple the traces to a connector such as a flex connector. The connector is used, for example, to couple the display 103 to an external device such as a display driver (e.g., a row driver and a column driver). A perimeter seal 112 is deposited on the substrate 121 so that an encapsulation lid (e.g., a glass lid, a metal cap, or a PCB) can be glued to the substrate in order to seal (e.g., encapsulate) the display 103. Because of the encapsulation lid, the connector can be attached only after substrate singulation.

FIG. 2 shows another schematic of the prior art passive-matrix OLED display 103. In FIG. 2, multiple OLEDs are fabricated on the substrate 121 of the display 103. The multiple OLEDs together form the active area 115 of the display 103. An encapsulation lid (e.g., a glass lid, a metal cap, or a PCB)(not shown) is glued to the substrate 121 using the perimeter seal 112 in order to encapsulate the display 103. The row and column traces (not shown) are routed to a contact pad 118 that is used to couple the traces to a connector such as a flex connector.

FIG. 3 shows a side view of the prior art passive-matrix OLED display 103. In FIG. 3, the perimeter seal 112 is deposited around the active area 115. The encapsulation lid 124 is placed on the perimeter seal 112 to encapsulate the active area.

Referring to FIG. 1, the conductive traces are routed to one side thus the traces originating from the other sides are relatively long. To reduce the overall usage of space on the substrate 121, the pitch between conductive traces is very fine and if many traces are used, the pitch between the long traces as it is routed to the one side is even smaller and the pitch between the traces at the contact pad is also even smaller. Having a fine pitch between traces increases the resistance of the traces and thus higher voltage drivers are used resulting in greater power consumption and increased resistive heating power loss in the traces. The increase in resistance and voltage results in fewer number of traces being used in the display and hence the number of rows and columns are reduced resulting in reduced display resolution and size. Having a fine pitch between traces increases the likelihood that one trace will electrically short another trace. In addition, the fine pitch can cause electrochemical reactions or electromigration that also increases the likelihood of an electrical short.

The area occupied by the routing of the conductive traces to the one side and the area occupied by the perimeter seal 112 is typically several millimeters. If a 400 mm by 400 mm mother glass on which an array of 10×10=100 displays is to be fabricated, the additional use of several millimeters for each display significantly reduces the number of displays per mother glass (for example, the reduction in the number of displays can be between 10% to 20%). If the number of displays per mother glass is reduced, then the cost per display increases.

The increase in the space occupied due to routing the traces to only one side and due to the perimeter seal 112 results in reduced design freedom. Thin-film electronic devices typically use precise top electrode deposition techniques, and typically have contact via holes inserted using, for example, laser ablation. These processes have a manufacturing tolerance resulting in an increase in the display size to account for the tolerance. If the space occupied by the conductive traces and the perimeter seal 112 is reduced, then the size of the display need not be increased to account for these tolerances. In addition, the availability of more space on the substrate 121 allows for greater tolerances for processes such as top electrode deposition and via hole insertion thus resulting in increased process yield and robustness of manufacturing.

For the foregoing reasons, there exists a need to fabricate, encapsulate and connect to the electronic thin-film device such that the space occupied on the substrate is minimized, device reliability is increased, and power consumption is reduced.

SUMMARY

An embodiment of an encapsulated electronic thin-film device is described that, for example, occupies less space on the substrate, has increased reliability, consumes less power, allows a connector to easily bond to the device, and allows a connector to be attached prior to substrate singulation. The embodiment of the encapsulated electronic thin-film device includes a substrate and an active area that is on the substrate. The active area includes at least one electronic thin-film element. The encapsulated electronic thin-film device also includes a thin-film encapsulation layer that covers at least the active area and this thin-film encapsulation layer is selectively deposited. The device further includes multiple conducting traces that are coupled to the active area. The multiple conducting traces protrude slightly past a perimeter of the thin-film encapsulation layer.

An embodiment of a method to encapsulate an electronic thin-film device is described that includes fabricating an active area on a substrate where the active area includes at least one electronic thin-film element. Fabricating the active area includes patterning multiple conductive traces that are coupled to the at least one electronic thin-film element. The method also includes selectively depositing a thin-film encapsulation layer on at least the active area so that at least the active area is covered. The multiple conductive traces are patterned such that they protrude slightly past a perimeter of the thin-film encapsulation layer.

DETAILED DESCRIPTION

In one embodiment of this invention, an encapsulated electronic thin-film device includes a substrate and an active area is fabricated on the substrate. The active area is made of at least one electronic thin-film element. A thin-film encapsulation layer is selectively deposited on at least the active area to cover at least the active area. Traces protrude slightly past a perimeter of the thin-film encapsulation layer. The traces are routed to two or more contact pads to which one or more connectors can attach. Attaching the connector to the contact pads allows an external device to be coupled to the active area of the electronic thin-film device.

Figure 1:
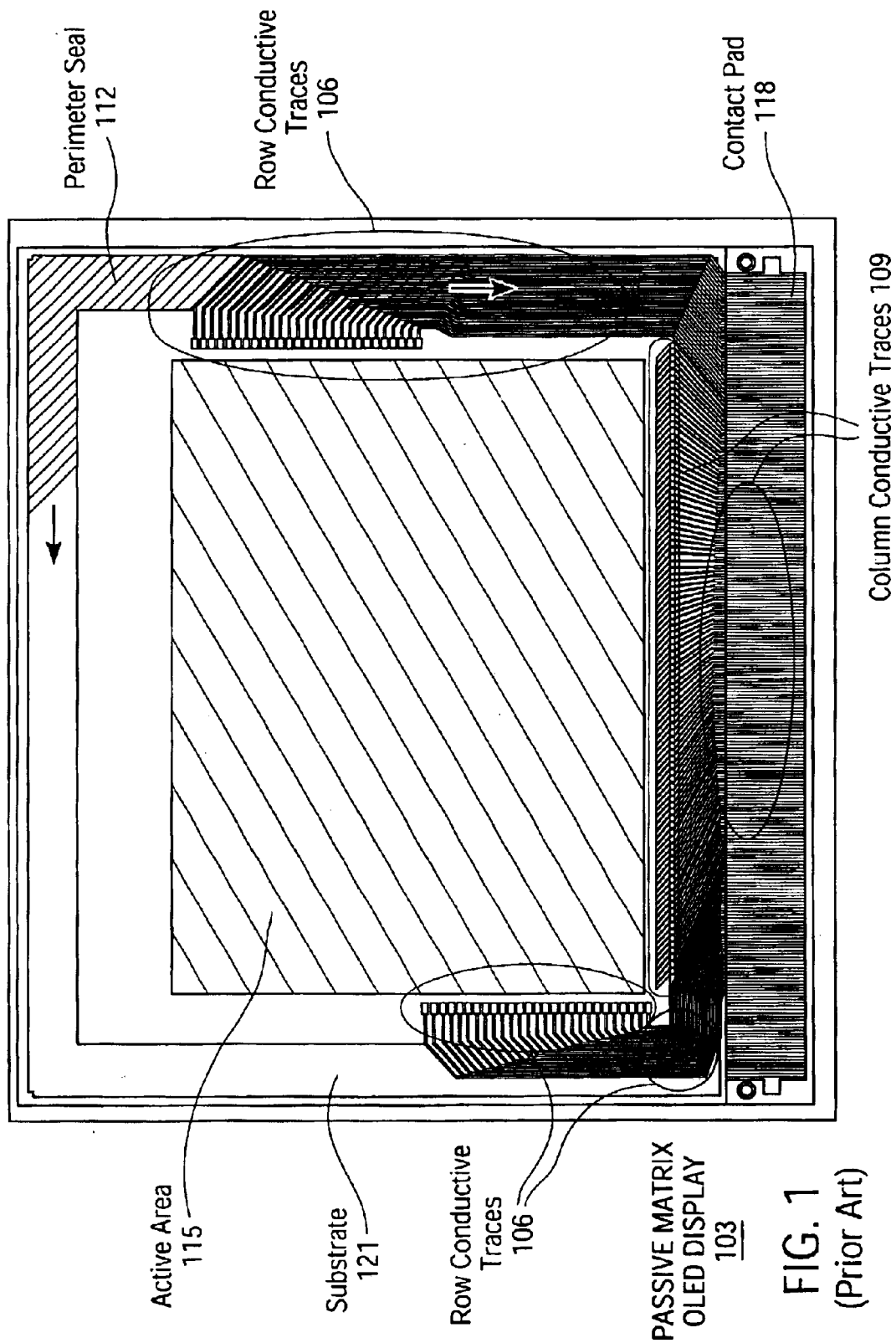
FIG. 1 shows a schematic of a prior art passive-matrix OLED display.
Figure 2:
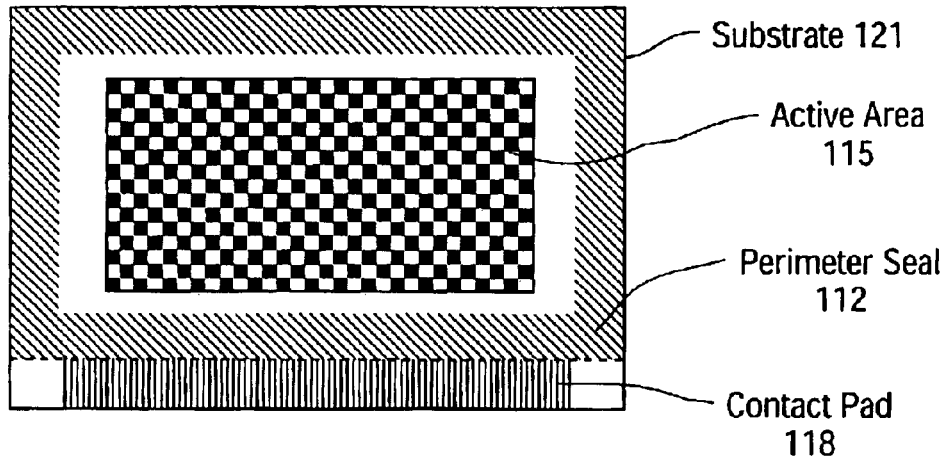
FIG. 2 shows another schematic of the prior art passive-matrix OLED display.
Figure 3:
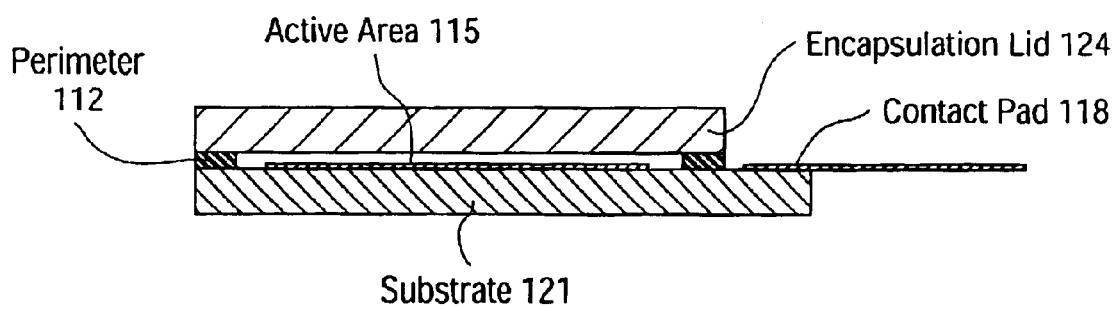
FIG. 3 shows a side view of the prior art passive-matrix OLED display.
Figure 4:
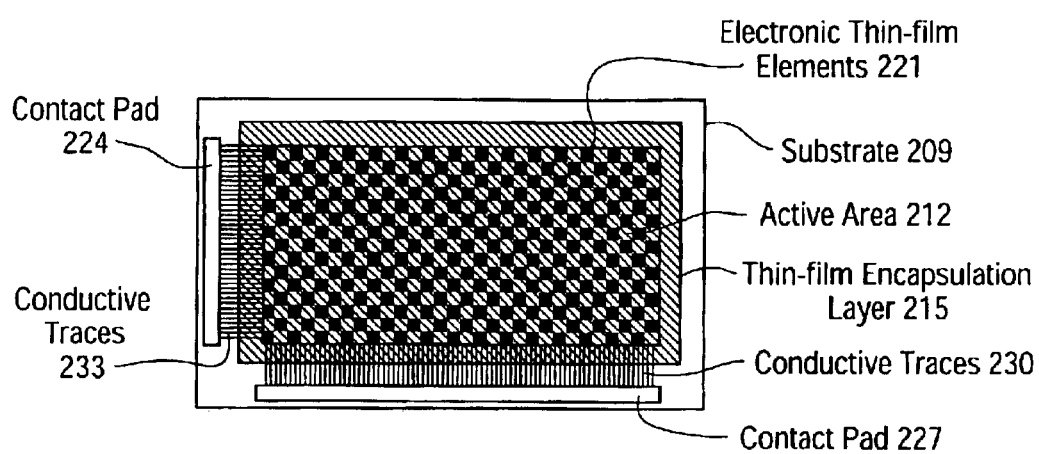
FIG. 4 shows a first embodiment of an encapsulated electronic thin-film device according to the present invention.

FIG. 4 shows a first embodiment of an encapsulated electronic thin-film device according to the present invention. An encapsulated electronic thin-film device 203 includes an active area 212 on a substrate 209. As used within the specification and the claims, the term "on" includes when there is direct physical contact between the two parts and when there is indirect contact between the two parts because they are separated by one or more intervening parts. The active area 212 is comprised of one or more electronic thin-film elements 221. The one or more electronic thin-film elements 221 is formed at the one or more intersections between the one or more row electrodes and the one or more column electrodes in which the one or more row electrodes are perpendicular to the one or more column electrodes and a semiconductive material is between those two electrodes. One end of the conductive traces 233 is coupled to the one or more row electrodes and one end of the conductive traces 230 is coupled to the one or more column electrodes. In one configuration of this embodiment, the active area 212 has a rectangular shape but in other configurations, the active area 212 has a circular shape or a square shape. The substrate 209 can be made of, for example: glass, silicon, inorganic semiconductor wafers, thin-film substrates (crystalline, polycrystalline or amorphous silicon), metal sheets or foils, quartz, plastic sheets or foils, and metallized plastic sheets or foils. The substrate 209 can also have additional functional films and/or coatings deposited on it. Examples of these films and/or coatings include color filters, moisture and/or oxygen barrier films, or planarizing layers.

A thin-film encapsulation layer 215 is selectively deposited on at least the active area 212 to cover at least the active area 212 (i.e., only the active area 212 is covered by the encapsulation layer 215, or the encapsulation layer 215 covers the active area and in addition covers an area slightly past the perimeter of the active area 212). The thickness of the thin-film encapsulation layer 215 is, for example, less than about 200 micrometers thick, preferably less than about 100 micrometers thick, more preferably less than about 50 micrometers thick. Thin-film encapsulation is described in the U.S. patent application entitled "Encapsulation for Organic Light Emitting Diodes Devices" having the application Ser. No. 10/137,163 and filed on May 2, 2002. Thin-film encapsulation is also described in the U.S. patent application entitled "Improved Encapsulation for Organic Electronic Devices" having the application Ser. No. 10/300,161 and filed on Nov. 20, 2002. Both of these applications are incorporated by reference herein in their entirety.

In the configuration shown in FIG. 4, the thin-film encapsulation layer 215 extends slightly past the perimeter of the active area 212. The range of this slight extension is, for example, from about 10 um to about 10 mm, and preferably from about 0.5 mm to about 3 mm. In another configuration (not shown), the thin-film encapsulation layer 215 may only cover the active area 212 and not extend past the perimeter of the active area 212. By depositing the thin-film encapsulation layer 215 rather than using the combination of the perimeter seal 112 and the encapsulation lid 124, the space previously occupied by the perimeter seal 112 becomes available thus increasing the amount of space available on the substrate 209.

In this embodiment, the conductive traces 233 and the conductive traces 230 protrude slightly past the perimeter of the thin-film encapsulation layer 215. The range of this slight protrude is, for example, from about 10 um to about 10 mm, and preferably from about 0.5 mm to about 3 mm. One end of each of the conductive traces 233 is coupled to the active area 212 (e.g., each conductive trace 233 is coupled to a corresponding one of the one or more row electrodes of the active area 212) and the other end is coupled to a contact pad 224. The contact pad 224 allows the conductive traces 233 to attach to a connector. Attaching a connector to the contact pad 224 provides coupling between an external device and the row electrodes of the active area 212 and thus, for example, an external device can control whether elements of the device 203 are activated. One end of each of the conductive traces 230 is coupled to the active area 212 (e.g., each column trace is coupled to a corresponding one of the one or more column electrodes) and the other end is coupled to a contact pad 227. The contact pad 227 allows the conductive traces 230 to attach to a connector. In this embodiment, the conductive traces 230, 233 protrude outward from two different sides of the active area 212, i.e., from the left side of the active area 212 and from the bottom-side of the active area 212.

In this embodiment, the conductive traces 230, 233 protrude only slightly past the perimeter of the thin-film encapsulation layer 215 and thus the traces are relatively short. The conductive traces 230, 233 are not routed to one side of the device 203 thus avoiding the use of relatively long traces originating from the other sides. By avoiding the use of relatively long traces and not routing them to one side of the device 203, the space occupied on the substrate 209 by the traces is reduced. The relatively shorter traces reduces the negative electrical impacts of the fine pitch between traces. Each of the short traces has less resistance than the long traces and thus require less voltage to drive the trace and thus consume less power. Also, by not using relatively long traces and routing them to only one side of the device 203, the pitch between traces is not further reduced as is the case when the relatively long traces are routed to only one side and is also the case at the contact pad. In addition, use of the thin-film encapsulation layer 215 decreases the thickness of the device 203. The thin-film encapsulation layer 215 allows a flex connector or a PCB to more easily bond with the device 203 than if thick encapsulation technology (e.g., the glass lid or the metal cap) was used. This is because the flex connector or the PCB can bond to an essentially flat surface due to the thin-film encapsulation layer 215.

Figure 5:
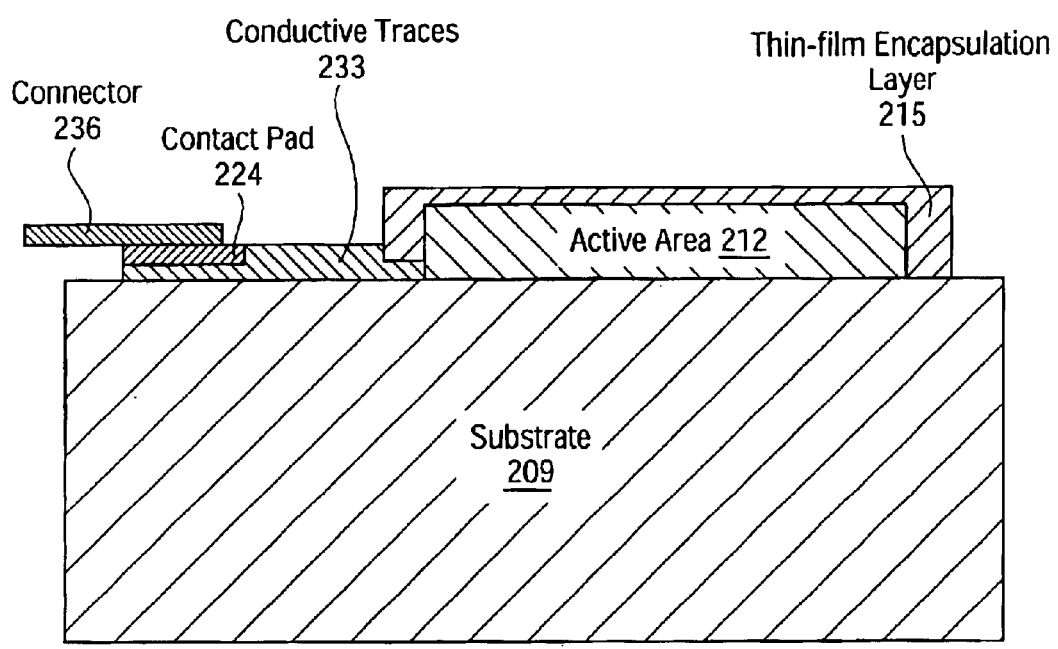
FIG. 5 shows a cross-sectional view of the first embodiment of the encapsulated electronic thin-film device 203 according to the present invention.

FIG. 5 shows a cross-sectional view of the first embodiment of the encapsulated electronic thin-film device 203 according to the present invention. The device 203 includes an active area 212 on the substrate 209. The active area 212 is comprised of one or more electronic thin-film elements. In the configuration shown in FIG. 5, the thin-film encapsulation layer 215 is selectively deposited on the active area 212 and extends slightly past the perimeter of the active area 212. The range of this slight extension can be, for example, from about 10 um to about 10 mm, and preferably from about 0.5 mm to about 3 mm. In another configuration (not shown), the thin-film encapsulation layer 215 covers only the active area 212 and does not extend past the perimeter of the active area 212. The conductive traces 233 are coupled to the active area 212 and protrude slightly past the perimeter of the thin-film encapsulation layer 215. The range of this slight protrude is, for example, from about 10 um to about 10 mm, and preferably from about 0.5 mm to about 3 mm. The conductive traces 233 are coupled to the contact pad 224. The contact pad 224 is coupled to the connector 236. Coupling the connector 236 to the contact pad 224 provides coupling between an external device and the row electrodes of the active area 212 and thus, for example, an external device can control whether elements of the device 203 are activated.

Figure 6:
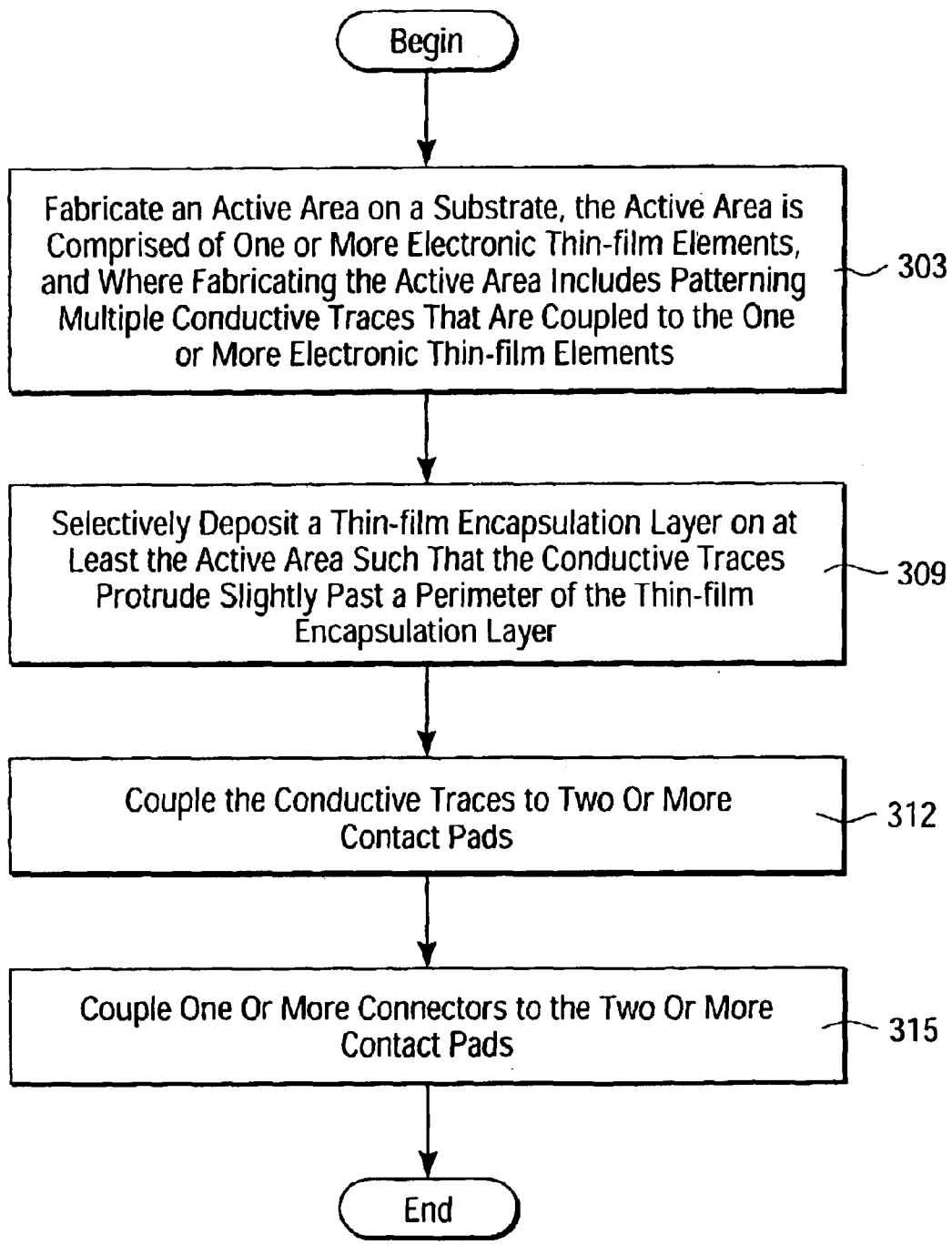
FIG. 6 shows an embodiment of a process to produce the encapsulated electronic thinfilm device 203 according to the present invention.

FIG. 6 shows an embodiment of a process to produce the encapsulated electronic thin-film device 203 according to the present invention. In block 303, the active area 212 is fabricated on the substrate 209. The active area 212 is comprised of one or more electronic thin-film elements. The active area 212 may be fabricated by, for example: selectively depositing one or more first electrodes on the substrate 209; selectively depositing a metallic layer on the substrate to form multiple conductive traces; selectively depositing one or more semiconductive layers on the one or more first electrodes; and selectively depositing one or more second electrodes on the one or more organic layers such that each of the one or more second electrodes is perpendicular to each of the one or more first electrodes. An electronic thin-film element is formed at each intersection of the one or more first electrodes and the one or more second electrodes. The metallic layer is selectively deposited such that the multiple conductive traces are coupled to the one or more first electrodes and the one or more second electrodes.

In block 309, the thin-film encapsulation layer 215 is selectively deposited on at least the active area 212 such that the conductive traces protrude slightly past a perimeter of the thin-film encapsulation layer 309. In block 312, the conductive traces are coupled to two or more contact pads. In block 315, one or more connectors are coupled to the two or more contact pads so that, for example, the external device via the connector can activate or deactivate the electronic thin-film elements.

Figure 7A:
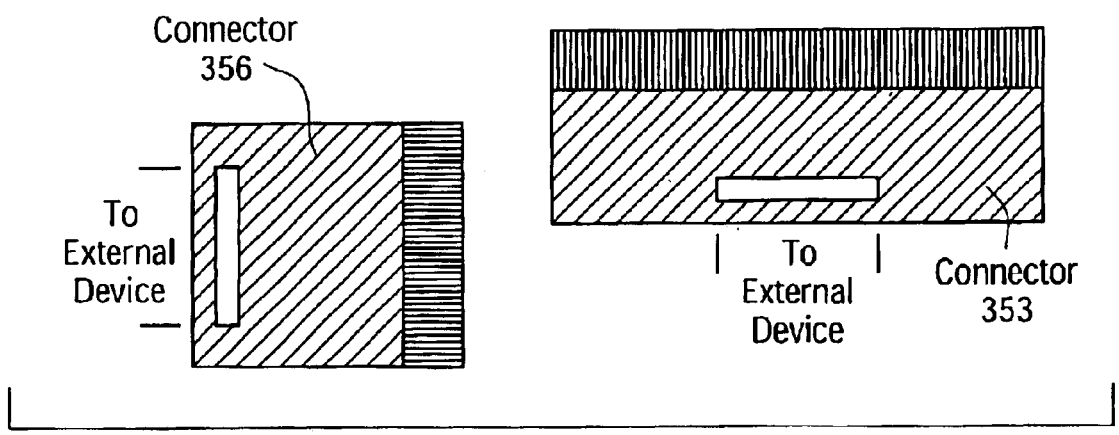
FIGS. 7a–c show embodiments of connectors according to the present invention.
Figure 7B:
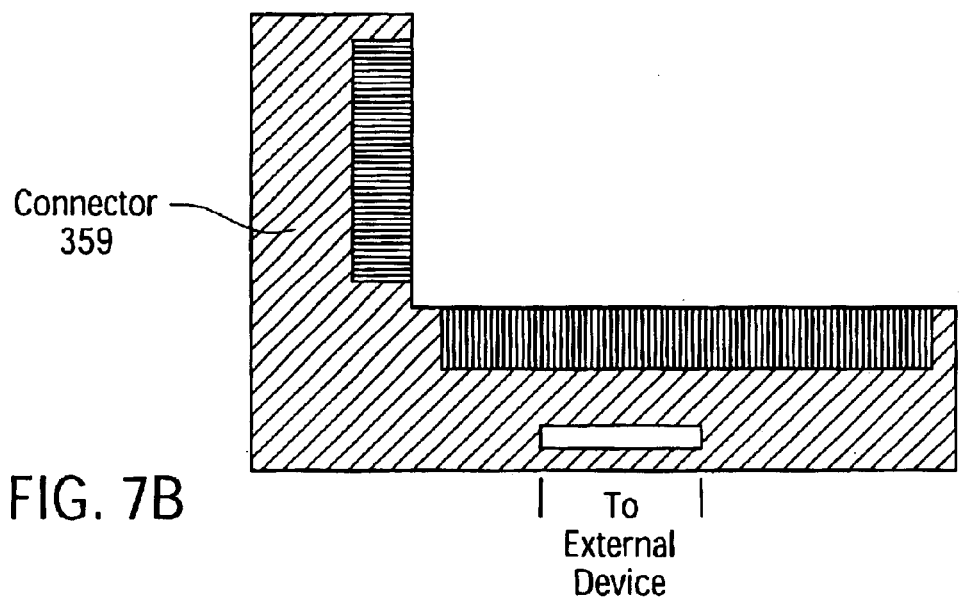
Figure 7C:
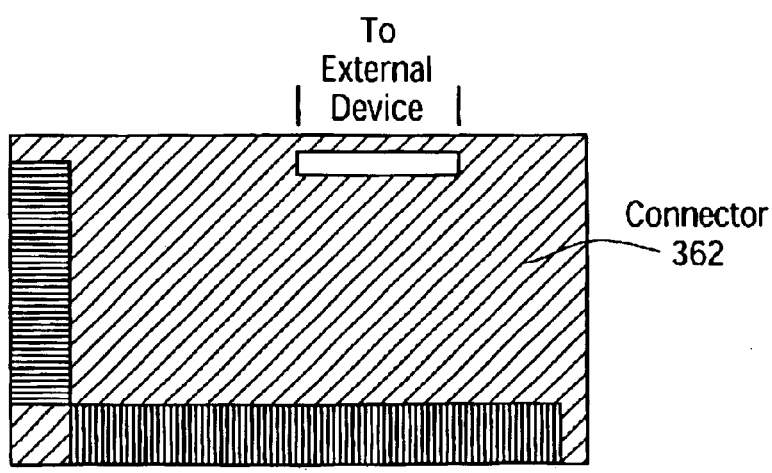

FIGS. 7a–c show embodiments of connectors according to the present invention. FIG. 7a shows a first embodiment of connectors according to the present invention. In FIG. 7a, two physically separate connectors attach to the two contact pads. Connector 353 attaches (i.e., couples) to the contact pad 227 (i.e., couples to the conductive traces 230), and connector 356 attaches (i.e., couples) to the contact pad 224 (i.e., couples to the conductive traces 233). Here, the connectors 353, 356 do not cover the active area 212. The bonding between a connector and the corresponding contact pad can occur using heat-seal connectors, anisotropic conductive adhesive ("ACF") bonding, solder-bump or ball-grid array bonding, Z-connector bonding, zebra-connector bonding, conductive paste or epoxy pads, thermal soldering, or laser-induced/mediated bonding.

FIG. 7b shows a second embodiment of a connector according to the present invention. In FIG. 7b, only one connector is used to attach to the two contact pads. Connector 359 attaches (i.e., couples) to both the contact pad 224 and the contact pad 227. Here, the connector 359 does not cover the active area 212. FIG. 7c shows a third embodiment of a connector according to the present invention. In FIG. 7c, only one connector is used to attach to the two contact pads. Connector 362 attaches to both the contact pad 224 and the contact pad 227. In this embodiment, the connector 362 is over the active area 212 and covers at least the active area 212. In yet another embodiment, one or more connectors may cover only a portion of the active area.

Between the thin-film encapsulation layer 215 and the connector may be one or more intervening layers, such as, for example, an insulating layer, a foam layer, a rubber layer, a deposited paste or potting compound, an adhesive layer (tape or coating), a layer containing a getter material (tape or coating, with or without additional encapsulation on top), an electrostatic discharge protecting layer, a scratch proofing layer, a heat dissipating layer or a reflecting layer. Each of the connectors 353, 356, 359, and 362 are attached to an external device. The external device can be: another flex connector that contains active and/or passive electronic components (e.g., driver or detector chip); a PCB; or a chip-on glass driver. In addition, the external device can also be a driver, a controller, an analyzer, a measurement instrument, or detector logic. The one or more connectors can be attached to the corresponding contact pads prior to substrate singulation.

Figure 8A:
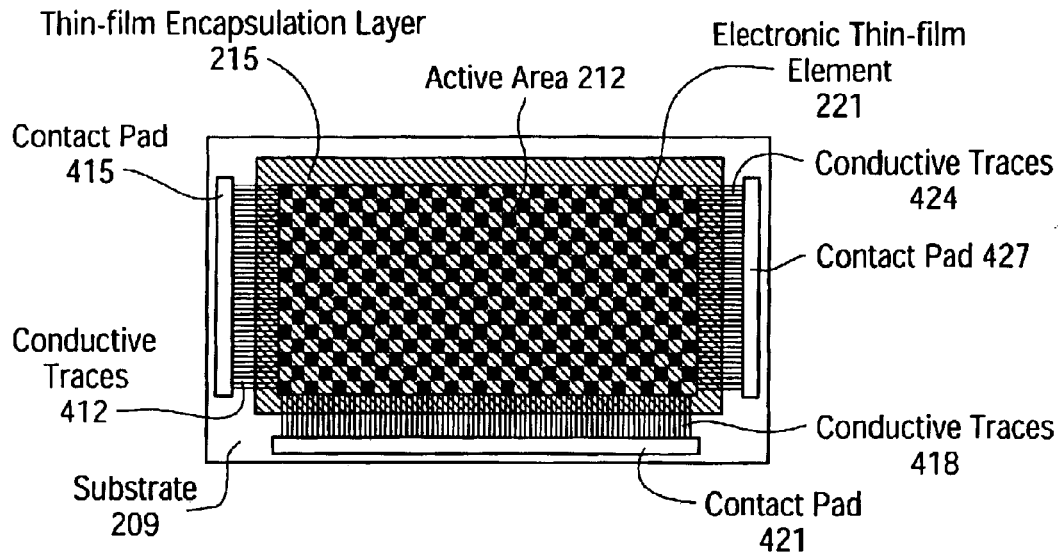
FIG. 8a shows a second embodiment of an encapsulated electronic thin-film device according to the present invention.

FIG. 8a shows a second embodiment of an encapsulated electronic thin-film device according to the present invention. An encapsulated electronic thin-film device 403 includes the active area 212 on the substrate 209. The active area 212 is comprised of one or more of the electronic thin-film elements 221. The thin-film encapsulation layer 215 is selectively deposited on at least the active area 212 to cover at least the active area 212. The thickness of the thin-film encapsulation layer 215 is, for example, less than about 200 micrometers thick, preferably less than about 100 micrometers thick, more preferably less than about 50 micrometers thick. In the configuration shown in FIG. 8a, the thin-film encapsulation layer 215 extends slightly past the perimeter of the active area 212. The range of this slight extension is, for example, from about 10 um to about 10 mm, and preferably from about 0.5 mm to about 3 mm. In another configuration (not shown), the thin-film encapsulation layer 215 may only cover the active area 212 and not extend past the perimeter of the active area 212. In this embodiment, the conductive traces 412, the conductive traces 418, and the conductive traces 424 protrude slightly past the perimeter of the thin-film encapsulation layer 215. The range of this slight protrude is, for example, from about 10 um to about 10 mm, and preferably from about 0.5 mm to about 3 mm. One end of each of the conductive traces 412 is coupled to the active area 212 and the other end is coupled to a contact pad 415. One end of each of the conductive traces 418 is coupled to the active area 212 and the other end is coupled to a contact pad 421. One end of each of the conductive traces 424 is coupled to the active area 212 and the other end is coupled to a contact pad 427.

Figure 8B:
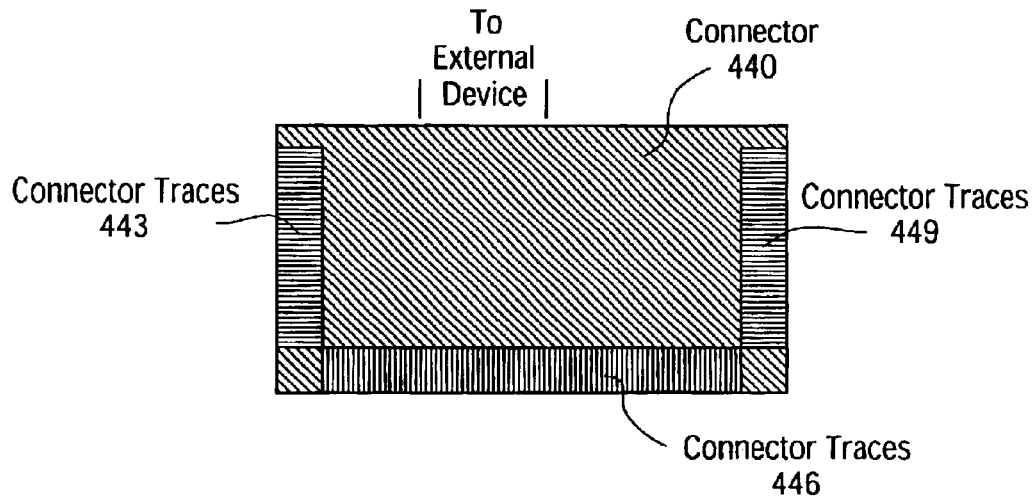
FIG. 8b shows a fourth embodiment of a connector according to the present invention.

FIG. 8b shows a fourth embodiment of a connector according to the present invention. In this embodiment, a connector 440 includes connector traces 443, connector traces 446, and connector traces 449. The connector traces 443 are coupled to the contact pad 415, the connector traces 446 are coupled to the contact pad 421, and the connector traces 449 are coupled to the contact pad 427. Here, the connector 440 covers all of the active area 212. In one configuration of this embodiment, each of the row electrodes of the active area 212 is coupled to a particular one of the conductive traces 412 and also a particular one of the conductive traces 424 and thus to the contact pad 415 and the contact pad 427 respectively. Coupling each of the row electrodes to both the contact pads reduces the voltage drops along the rows inside the active area 212. In another configuration, the conductive traces 412 and the conductive traces 424 are each coupled to only half of the row electrodes. For example, the conductive traces 424 are coupled to the even-numbered row electrodes of the active area 212 and the conductive traces 424 are coupled to the odd-numbered row electrodes. By splitting the coupling to the row electrodes between the two different sets of traces, the pitch between two traces of the conductive traces 412 and the conductive traces 424 is reduced and the pitch between traces at the contact pad is also reduced. The connector 440 is coupled to an external device.

Figure 9A:
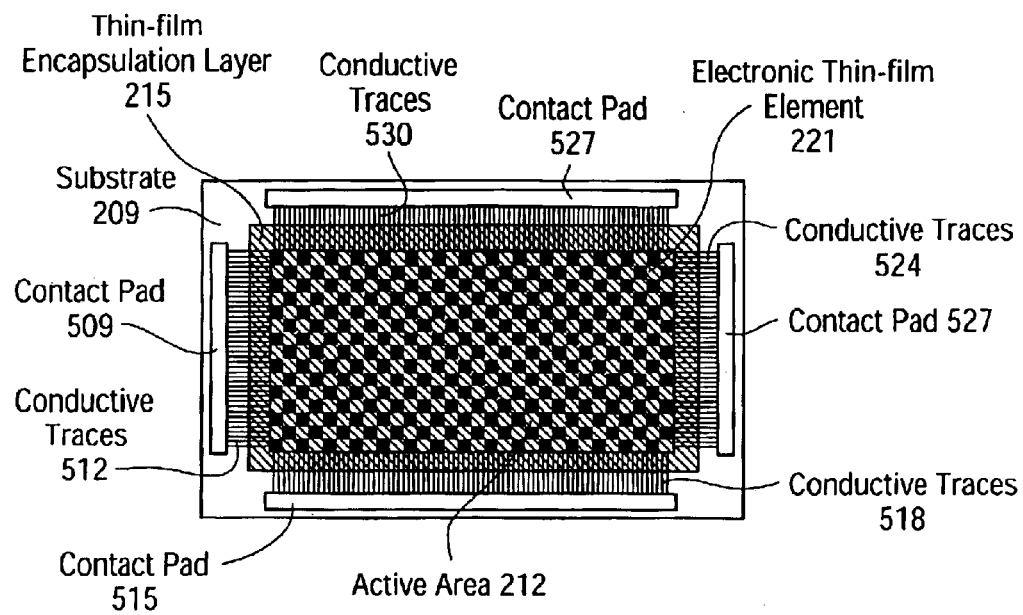
FIG. 9a shows a third embodiment of an encapsulated electronic thin-film device according to the present invention.

FIG. 9a shows a third embodiment of an encapsulated electronic thin-film device according to the present invention. Descriptions for the following elements were provided earlier: the substrate 209, the active area 212, the one or more electronic thin-film elements 221, and the thin-film encapsulation layer 215. One end of each of the conductive traces 512 is coupled to the active area 212 and the other end is coupled to a contact pad 509. One end of each of the conductive traces 518 is coupled to the active area 212 and the other end is coupled to a contact pad 515. One end of each of the conductive traces 521 is coupled to the active area 212 and the other end is coupled to a contact pad 524. One end of each of the conductive traces 530 is coupled to the active area 212 and the other end is coupled to a contact pad 527.

Figure 9B:
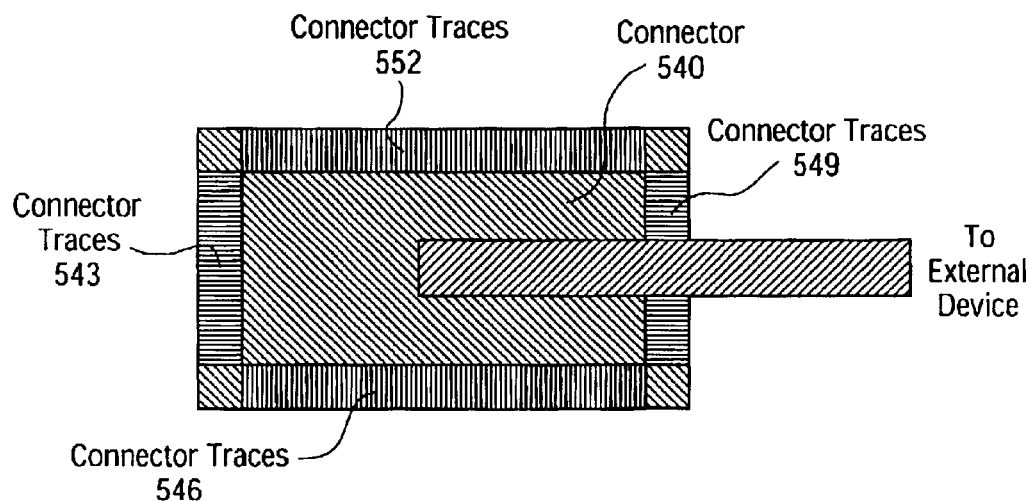
FIG. 9b shows a fifth embodiment of a connector according to the present invention.

FIG. 9b shows a fifth embodiment of a connector according to the present invention. In this embodiment, a connector 540 includes connector traces 543, connector traces 546, connector traces 549, and connector traces 552. The connector traces 543 are coupled to the contact pad 509, the connector traces 546 are coupled to the contact pad 515, the connector traces 549 are coupled to the contact pad 524, and the connector traces 552 are coupled to the contact pad 527. Here, the connector 540 covers all of the active area 212. In one configuration of this embodiment, each of the row electrodes of the active area 212 is coupled to a particular one of the conductive traces 512 and also a particular one of the conductive traces 521 and thus to the contact pad 515 and the contact pad 524 respectively. Also, each of the column electrodes of the active area 212 is coupled to a particular one of the conductive traces 530 and also a particular one of the conductive traces 518 and thus to the contact pad 527 and the contact pad 515 respectively. Coupling each of the row electrodes and column electrodes to the two corresponding contact pads reduces the voltage drops along the rows and columns inside the active area 212. In another configuration, one set of conductive traces (i.e., conductive traces 512, conductive traces 518, conductive traces 521, or conductive traces 530) is coupled to half of the row electrodes or half of the column electrodes. For example, the conductive traces 512 are coupled to the even-numbered row electrodes of the active area 212 and the conductive traces 521 are coupled to the odd-numbered row electrodes of the active area 212. Also, the conductive traces 530 are coupled to the even-numbered column electrodes of the active area 212 and the conductive traces 518 are coupled to the odd-numbered column electrodes of the active area 212. By doing this, the pitch between conductive traces is reduced and the pitch between traces at the contact pad is also reduced. The connector 540 is coupled to an external device.

Figure 10:
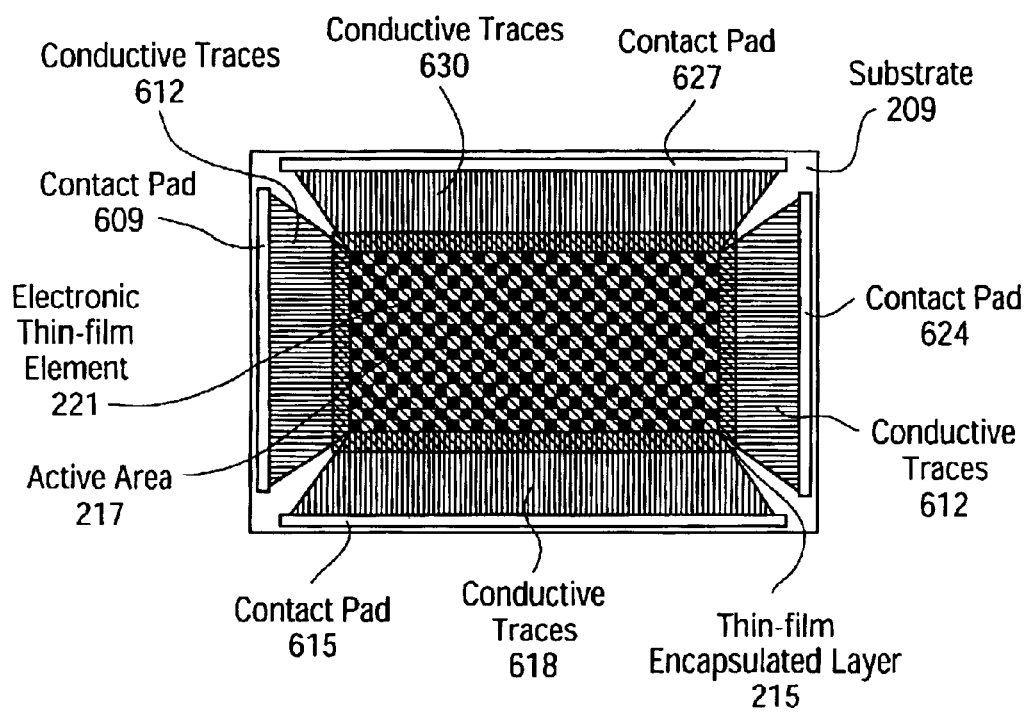
FIG. 10 shows a fourth embodiment of an encapsulated electronic thin-film device according to the present invention.

FIG. 10 shows a fourth embodiment of an encapsulated electronic thin-film device according to the present invention. Descriptions for the following elements were provided earlier: the substrate 209, the active area 212, the one or more electronic thin-film elements 221, and the thin-film encapsulation layer 215. Conductive traces 612 fan-out from the active area 212 to contact pad 609; the fan-out of the traces increase the pitch between each of the conductive traces 612. Conductive traces 618 fan-out from the active area 212 to contact pad 615; the fan-out of the traces increase the pitch between each of the conductive traces 615. Conductive traces 621 fan-out from the active area 212 to contact pad 624; the fan-out of the traces increase the pitch between each of the conductive traces 621. Conductive traces 630 fan-out from the active area 212 to contact pad 627; the fan-out of the traces increase the pitch between each of the conductive traces 630.

As any person of ordinary skill in the art of electronic device fabrication and encapsulation will recognize from the description, figures, and examples that modifications and changes can be made to the embodiments of the invention without departing from the scope of the invention defined by the following claims.

What is claimed:

1. An encapsulated electronic thin-film device, comprising:
    a substrate;
    an active area on said substrate, said active area includes at least one electronic thin-film elements;
    a thin-film encapsulation layer that covers at least said active area, said thin-film encapsulation layer is selectively deposited; and
    a plurality of conducting traces coupled to said active area, said plurality of conducting traces protrude slightly past a perimeter of said thin-film encapsulation layer,
    wherein said thin-film encapsulation layer protrudes past a perimeter of said active area by a range of about 0.5 mm to about 3.0 mm and
    wherein said plurality of conducting traces protrudes past said perimeter of said thin-film encapsulation layer by a range of about 0.5 mm to about 3.0 mm.

2. The encapsulated electronic thin-film device of claim 1 further comprising one or more connectors, said one or more connectors couple to said plurality of conducting traces on two or more different sides of said active area.

3. The encapsulated electronic thin-film device of claim 1 further comprising a connector that covers at least a portion of said active area.

4. The encapsulated electronic thin-film device of claim wherein the slight protrusion of said plurality of conducting traces is from two or more different sides of said active area.

5. The encapsulated electronic thin-film device of claim 4 wherein a portion of said plurality of conducting traces protruding from each of said two or more different sides of said active area is coupled to a corresponding one of two or more contact pads.

6. The encapsulated electronic thin-film device of claim 5 wherein each of said two or more contact pads is placed about 10 um to about 10 mm from said thin-film encapsulation layer.

7. The encapsulated electronic thin-film device of claim 1 wherein said plurality of conducting traces fan outward from said active area.

8. The encapsulated electronic thin-film device of claim 1 wherein said electronic thin-film device is any one of: an active matrix OLED display, a passive matrix OLED display, an OLED light source, an active matrix inorganic electroluminescent display, a passive matrix inorganic electroluminescent display, an organic light detector array, an inorganic light detector array, an organic solar cell array, an inorganic solar cell array, an organic thin-film transistor array, or an inorganic thin-film transistor array.

9. The encapsulated electronic thin-film device of claim 1 wherein said at least one electronic thin-film element is any one of: at least one OLED, at least one inorganic pixel element, at least one light detector element, at least one solar cell element, or at least one thin-film transistor element.

10. The encapsulated electronic thin-film device of claim 1 wherein said thin-film encapsulation layer has a thickness less than about 100 micrometers.

11. The encapsulated electronic thin-film device of claim 10 wherein said thin-film encapsulation layer has a thickness less than about 50 micrometers.

12. A method to encapsulate an electronic thin-film device, comprising:
    fabricating an active area on a substrate, said active area includes at least one electronic thin-film element, wherein fabricating said active area includes patterning a plurality of conductive traces that are coupled to said at least one electronic thin-film element; and
    selectively depositing a thin-film encapsulation layer on at least said active area to cover at least said active area,
    wherein said plurality of conductive traces are patterned such that they protrude slightly past a perimeter of said thin-film encapsulation layer,
    wherein said thin-film encapsulation layer protrudes past said perimeter of said active area by a range of about 0.5 mm to about 3.0 mm, and
    wherein said plurality of conducting traces protrudes pass said perimeter of said thin-film encapsulation layer by a range of about 0.5 mm to about 3.0 mm.

13. The method of claim 16 wherein fabricating said active area includes
    selectively depositing at least one first electrode on said substrate;
    wherein patterning said plurality of conductive traces includes selectively depositing a metallic layer on said substrate to form said plurality of conductive traces;
    selectively depositing at least one semiconductive layer on said at least one first electrode; and
    selectively depositing at least one second electrode on said at least one semiconductive layer,
    wherein coupling said plurality of conductive traces to said at least one electronic thin-film element includes coupling said plurality of conductive traces to said at least one first electrode and said at least one second electrode.

14. The method of claim further comprising
    coupling said plurality of conductive traces to a plurality of contact pads.

15. The method of claim 14 comprising
    coupling at least one connector to said plurality of contact pads.

16. The method of claim 15 further comprising
    singulating said substrate,
    wherein said at least one connector is coupled to said plurality of contact pads prior to singulating said substrate.

17. The method of claim 12 further comprising
    placing a connector on at least a portion of said active area to cover at least said portion of said active area.

18. The method of claim 12 wherein said plurality of conducting traces protrude from two or more different sides of said active area.

19. The method of claim 12 wherein said thin-film encapsulation layer extends to a perimeter of said active area or protrudes slightly past said perimeter of said active area.

20. The method of claim 12 wherein said electronic thin-film device is any one of: an active matrix OLED display, a passive matrix OLED display, an OLED light source, an active matrix inorganic electroluminescent display, a passive matrix inorganic electroluminescent display, an organic light detector array, an inorganic light detector array, an organic solar cell array, an inorganic solar cell array, an organic thin-film transistor array, or an inorganic thin-film transistor array.

21. The method of claim 12 wherein said at least one electronic thin-film element is any one of: at least one OLED, at least one inorganic pixel element, at least one light detector element, at least one solar cell element, or at least one thin-film transistor element.

22. The method of claim 12 wherein said thin-film encapsulation layer has a thickness less than about 100 micrometers.

23. The method of claim 22 wherein said thin-film encapsulation layer has a thickness less than about 50 micrometers.

* * * * *